United States Patent [19]

Yamamoto et al.

[11] Patent Number: 4,959,613
[45] Date of Patent: Sep. 25, 1990

[54] NMR IMAGING APPARATUS

[75] Inventors: Etsuji Yamamoto, Akishima; Hideki Kohno, Tokyo, both of Japan

[73] Assignee: Hitachi, Ltd., Tokyo, Japan

[21] Appl. No.: 319,728

[22] Filed: Mar. 7, 1989

[30] Foreign Application Priority Data

Mar. 8, 1988 [JP] Japan .................................. 63-53942

[51] Int. Cl.$^5$ ............................................. G01R 33/20
[52] U.S. Cl. ..................................... 324/318; 324/319
[58] Field of Search ............... 324/318, 319, 307, 309, 324/320, 322

[56] References Cited

U.S. PATENT DOCUMENTS

| | | | |
|---|---|---|---|
| 4,165,479 | 8/1979 | Mansfield | 324/309 |
| 4,506,222 | 3/1985 | Edelstein et al. | 324/309 |
| 4,607,716 | 6/1987 | Kunz | 324/320 |
| 4,644,277 | 2/1987 | Kunz | 324/309 |
| 4,755,755 | 7/1988 | Carlson | 324/319 |

FOREIGN PATENT DOCUMENTS 0165648  7/1986  Japan .

*Primary Examiner*—Michael J. Tokar
*Assistant Examiner*—Kevin D. O'Shea
*Attorney, Agent, or Firm*—Antonelli, Terry, Stout & Kraus

[57] ABSTRACT

A field gradient generator in an NMR imaging apparatus comprises three sets of field gradient generating coils for respectively generating field gradients in three orthogonal directions in a space to be observed. Each set of coils includes a plurality of unit coils through which individual currents respectively flow. There are prepared a plurality of unit drivers which are for exclusive uses of the respective unit coils or are connected arbitrarily to each unit coil. Thereby, the lowering of an allowable operating voltage is implemented by use of a parallel operation of the unit drivers.

6 Claims, 4 Drawing Sheets

NMR IMAGING APPARATUS

BACKGROUND OF THE INVENTION

The present invention relates to an imaging apparatus utilizing a nuclear magnetic resonance (NMR) phenomenon, and more particularly to a field gradient generator for generating a field gradient which changes at a high speed and has a large amplitude.

In an imaging apparatus utilizing an NMR phenomenon, it is necessary to separate and discriminate a signal from an object with a correspondence of the signal to a position in the object. There is one method in which position information is acquired by applying a field gradient to a magnetic field in which an object is placed, thereby producing a different resonance frequency or phase encoding amount. The basical principle of this method is disclosed by, for example, U.S. Pat. No. 4,506,222. Most of the NMR imaging apparatuses using this method and another position discriminating method include three sets of gradient coils which generate field gradients in three orthogonal directions respectively. The gradient coils are driven by respective independent drivers in predetermined sequences. JP-A-61-165648 discloses an example in which a multiple-coil arrangement is employed for a field gradient in a radial direction. An additional coil in the disclosed example is provided for eliminating higher order components of the magnetic field.

In the case where an object such as a heart involving any movement is to be examined, a large current must be applied to a coil in order to generate a large field gradient which changes at a high speed. This involves a problem that a component having a high withstanding or allowable operating voltage must be used for an FET, bipolar transistor or the like used as a driver. In an imaging method disclosed by U.S. Pat. No. 4,165,479, a field gradient in one direction is fixed and a field gradient in another direction is applied while the gradient direction is repetitively reversed. Where an image of a certain plane is required (planar imaging), one of field gradients to be subjected to reversals must be selected depending on the direction of that plane. Further, it is required that the field gradient to be subjected to reversals has a much higher changing rate and a much larger amplitude than the other field gradient.

SUMMARY OF THE INVENTION

Accordingly, an object of the present invention is to provide an NMR imaging apparatus in which a large field gradient changing at a high speed can be generated by using as a driver a component having a relatively low withstanding voltage.

Another object of the present invention is to provide an NMR imaging apparatus having field gradient generating means suitable for the case where only any one or two of field gradients in three directions conformable to an intended imaging has a high changing rate and a large amplitude while the remaining field gradients or gradient have low changing rates and small amplitudes.

A feature of the present invention lies in that three sets of gradient coils for respectively generating field gradients in three directions are provided and at least one set of gradient coils is divided into a plurality of unit coils which are independently driven by individual drivers.

Another feature of the present invention lies in that each of three sets of gradient coils for generating field gradients in three directions is divided into a plurality of unit coils, a plurality of drivers are respectively provided for driving of the unit drivers, and switch means is provided for connecting the drivers and the unit coils in any combination thereof.

DESCRIPTION OF THE PREFERRED EMBODIMENTS

Embodiments of the present invention will now be explained in reference with the accompanying drawings.

Figure 2:
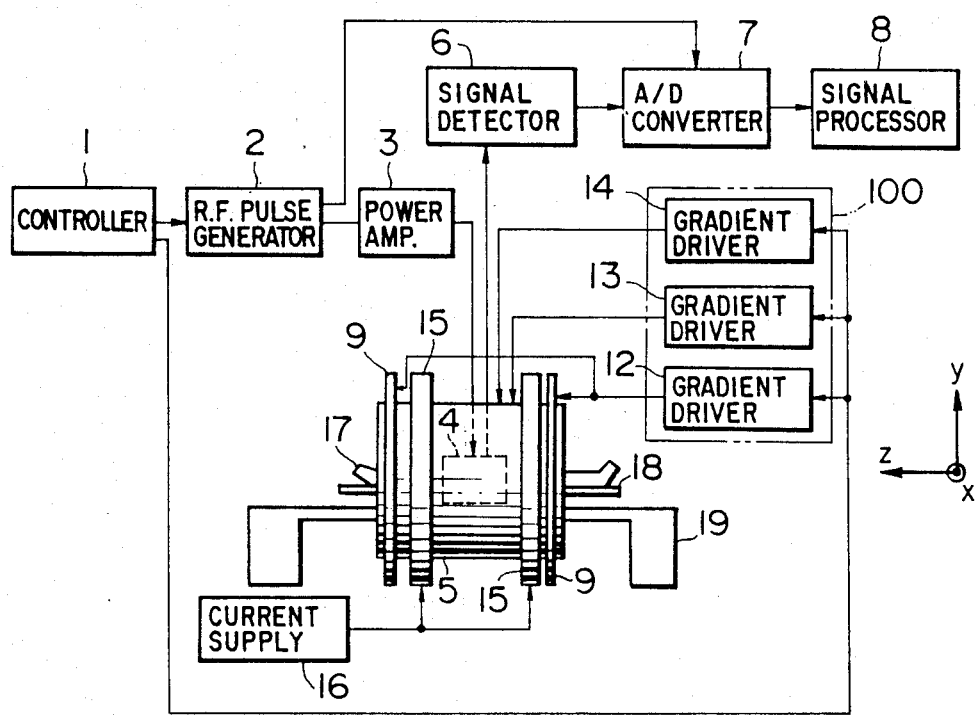
FIG. 2 is a block diagram showing the whole construction of the embodiment shown in FIG. 1.

FIG. 2 is a block diagram showing the whole construction of an NMR imaging apparatus according to an embodiment of the present invention. In FIG. 2, reference numeral 1 designates a controller, numeral 2 an RF pulse generator, numeral 3 a power amplifier, numeral 4 RF coils for applying an RF magnetic field to an object 17 and detecting a signal derived from the object 17, numeral 6 a signal detector, numeral 7 an A/D converter, and numeral 8 a signal processor.

Static magnetic field coils 15 are supplied with power from a power source or current supply 16 to generate a uniform static magnetic field in a z-axis direction in a space to be observed. $G_z$ gradient coils 9, which will be described in later, are disposed adjacent to the static magnetic field coils 15 and are driven by a driver 12 to provide a gradient in the z-axis direction to the intensity of the static magnetic field in the above-mentioned space. Inside the coils 15 and 16 is prOvided a cylindrical bobbin 5 on which $G_x$ and $G_y$ gradient coils (not shown) are disposed. The $G_x$ and $G_y$ gradient coils are respectively driven by drivers 13 and 14 to provide field gradients in x-axis and y-axis directions in the above-mentioned space. The RF coils 4 are disposed inside the bobbin 5. A human body 17, which is the object to be examined and is placed on a bed 18, is inserted into the space in the bobbin 5 to be observed. The bed 18 is movably mounted on a supporting bench 19.

The controller 1 has a function of issuing various instructions to the respective components of the apparatus at a constant or predetermined timing. An output of the RF pulse generator 2 is amplified by the power amplifier 3 to excite the RF coils 4. A signal component received by the RF coils 4 is passed through the signal detector 6, then A/D converted by the A/D converter 7 and thereafter transformed into an image by the signal processor 8.

Figure 1:
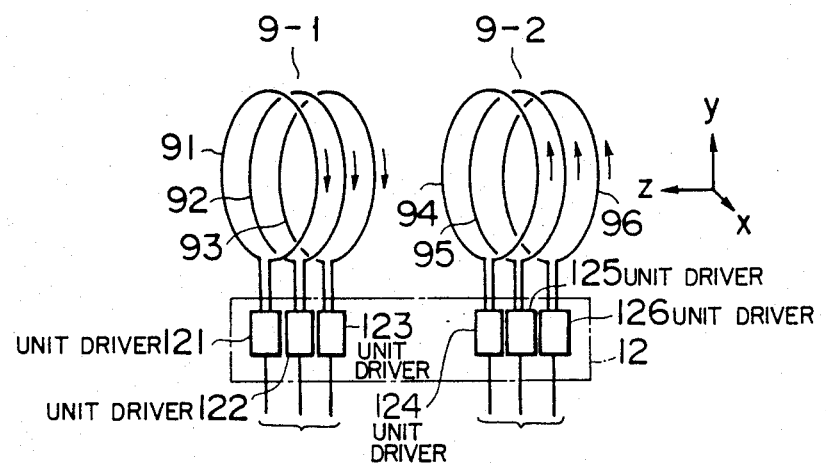
FIG. 1 is a perspective view showing a main part of an embodiment of the present invention.

FIG. 1 shows in detail the constructions of the gradient coils 9 and driver 12 shown in FIG. 2. Through first and second parts 9-1 and 9-2 of the coils 9 currents flow having directions or senses reverse to each other as indicated by arrows in FIG. 1 so that a linear gradient in the z-axis direction is provided to the intensity of the static magnetic field in the space to be observed between the first and second coil parts 9-1 and 9-2. The coils 9 are divided into six unit coils 91 to 96. The driver 12 includes six unit drivers 121 to 126 which are provided for individually or independently driving the respective unit coils 91 to 96. The unit coils are respectively connected to the unit drivers so that driving currents for the unit coils are individually supplied from the respective unit drivers. Each unit driver is a current amplifier which produces an output having a waveform corresponding to or conformable to a control signal supplied from the controller 1 shown in FIG. 2. Alternatively, there may be used a pulse width modulated current amplifier the output current value of which is controlled through pulse width modulation. In either case, each unit driver is controlled so that it produces the substantially same output waveform for the same control signal. With the above construction of $G_z$ gradient generating means, a large field gradient changing at a high speed can be generated even if a power voltage for the driver is relatively low. In other words, a component having a low withstanding or allowable operating voltage can be used as an active component constituting the driver. Namely, a voltage V between opposite ends of a coil having an inductance L is represented by $V = L \cdot di/dt$ wherein i is a current supplied. The power voltage for the coil driver must be selected to be a value equal to or larger than the voltage V. The higher the changing rate of a magnetic field to be generated or the current i, the larger the value of the power voltage for the coil driver becomes. However, in the above-mentioned coil driving in a dividing manner, since an inductance L of each unit coil is small, the value of V becomes low, thereby making it possible to keep the power voltage for the unit driver low. In the illustrated example of six divisions in the present embodiment, the power voltage can be lowered from 40 volts to a value not higher than 10 volts.

Figure 3:
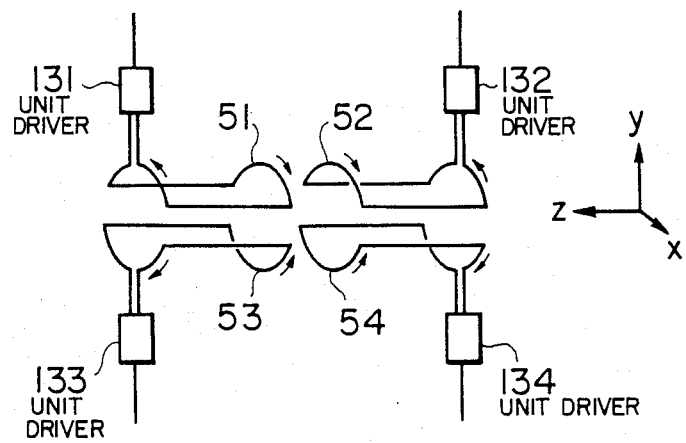
FIGS. 3, 4 and 5 are perspective views showing further embodiments of the present invention respectively.
Figure 4:
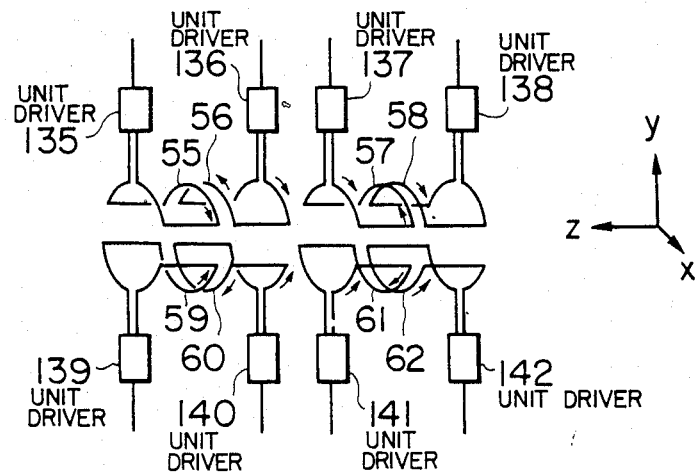
Figure 5:
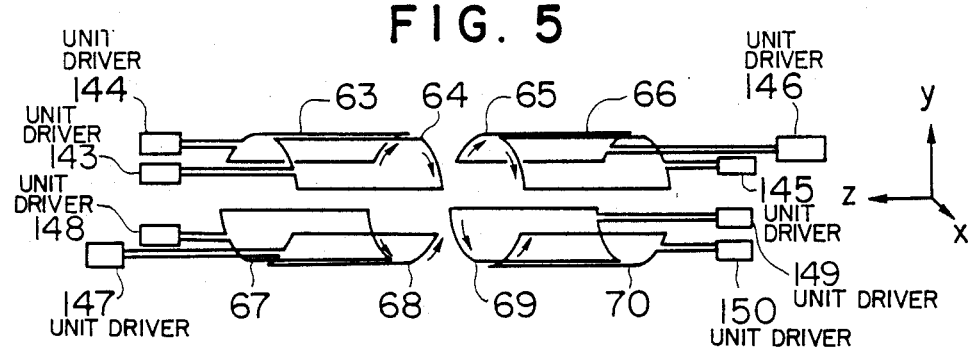

In the foregoing has been explained the embodiment in which the $G_z$ gradient generator for generating the field gradient in the z-direction parallel to the static magnetic field is divided. The division scheme can be similarly applied to $G_x$ or $G_y$ gradient generator for generating field gradients in x- or y-direction orthogonal to the static magnetic field. FIG. 3 shows an example of the $G_y$ gradient generator. Four unit coils 51 to 54 are formed on the cylindrical bobbin 5 shown in FIG. 2. Currents having directions indicated by arrows or reverse directions flow through the four unit coils so that a field gradient in the y-direction is generated in a space to be observed in a central portion between the four unit coils. The unit coils 51 to 54 are individually driven by unit drivers 131 to 134, respectively. FIG. 4 shows another example of the $G_y$ gradient generator in which eight unit coils 55 to 62 and eight unit drivers 135 to 142 are provided. FIG. 5 shows a further example of the $G_y$ gradient generator in which eight unit coils 63 to 70 and eight unit drivers 143 to 150 are provided. In the coil arrangement shown in FIG. 4, each of the unit coils shown in FIG. 3 is further divided into two parts in the z-direction, for example, with the unit coils 55 and 56 arranged in the z-direction. In the coil arrangement shown in FIG. 5, each of the unit coils shown in FIG. 3 is divided into two parts in a direction of circumference of the bobbin 5, for example, with the unit coils 63 and 64 arranged in the circumferential direction.

In each of the examples shown in FIGS. 1, 3, 4 and 5, the plurality of unit coils have their forms similar to each other and their inductances substantially equal to each other. Equal currents flow through the respective unit coils so that a desired field gradient is generated as a whole. Therefore, the plurality of unit drivers are controlled so as to provide their outputs having the same waveform. However, in an example as shown in FIG. 4 in which a field gradient in a direction orthogonal to the static magnetic field is generated by a plurality of unit coils arranged along the direction of the static magnetic field, it should be noted that the unit coils used may be selected in accordance with the size of an area to be observed. Namely, in the case where the area to be observed is large and it is necessary to generate a linear field gradient over a wide range in the z-direction, all the unit coils 55 to 62 shown in FIG. 4 are used to generate the field gradient in the y-direction. On the other hand, in the case where the generation of a linear field gradient is necessary only in a limited small range in the z-direction, only the inner unit coils 56, 57, 60 and 61 among the unit coils shown in FIG. 4 are used to generate the field gradient in the y-direction. In this manner, power necessary for generating the field gradient can be saved.

Like the $G_y$ gradient coils, the $G_x$ gradient coils can employ a divided coil arrangement similar to that shown in FIG. 3, 4 or 5. In that case, unit coils are formed on the bobbin 5 of FIG. 2 in a direction rotated by 90° from the direction shown in FIG. 3, 4 or 5.

Figure 6A:
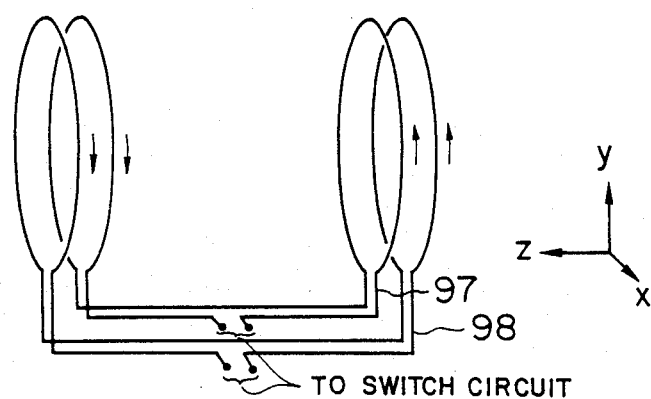
FIGS. 6A, 6B and 6C are perspective views showing another embodiment of the present invention.
Figure 6B:
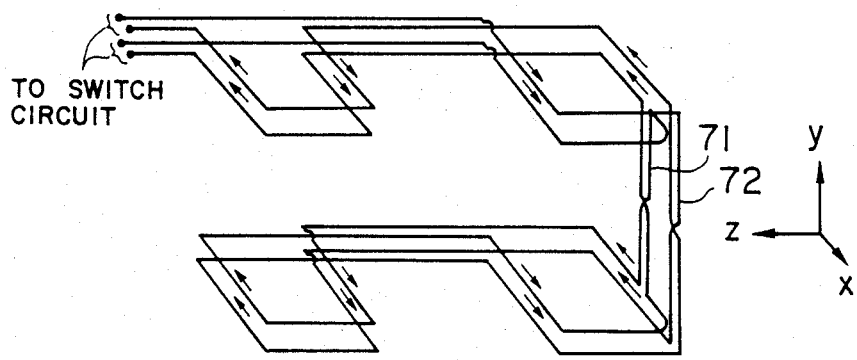
Figure 6C:
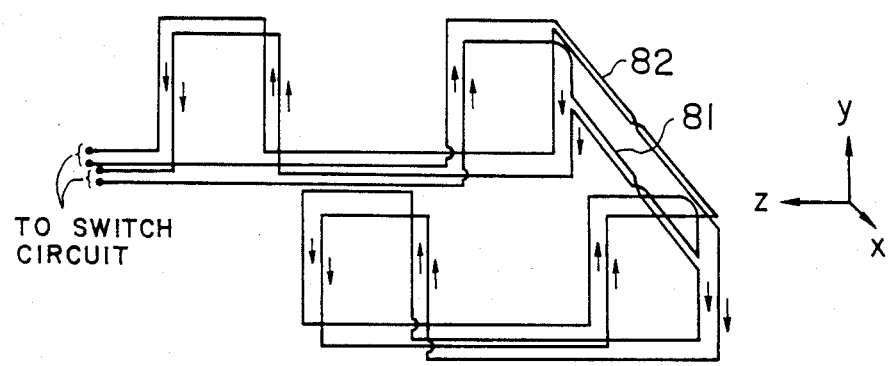
Figure 7:
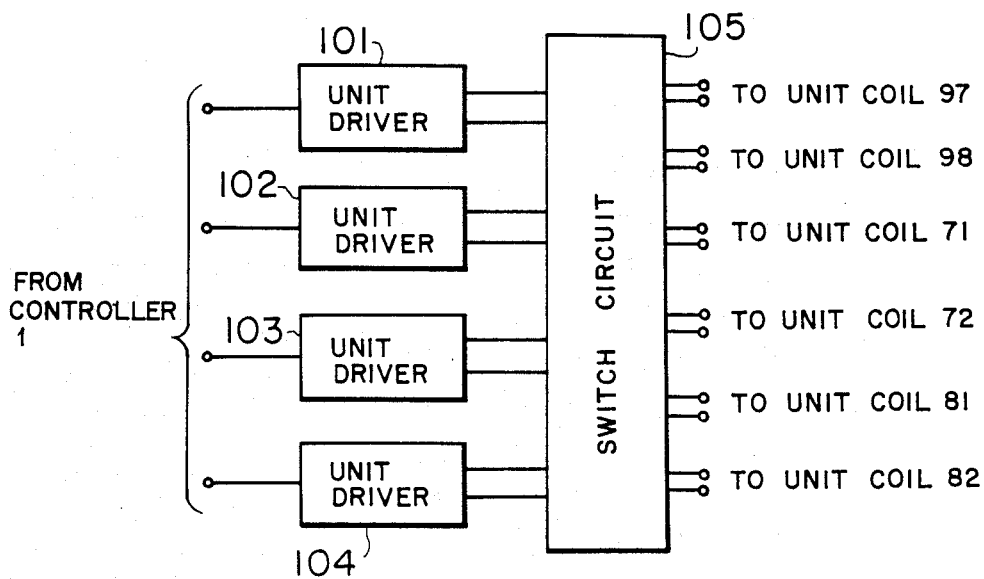
FIGS. 7 and 8 are block diagrams showing different examples of a driver circuit used in the embodiment shown in FIGS. 6A to 6C.

FIGS. 6A to 6C show another embodiment of the present invention. $G_z$ gradient coils shown in FIG. 6A are formed by two unit coils 97 and 98. $G_y$ gradient coils shown in FIG. 6B are formed by two unit coils 71 and 72. $G_x$ gradient coils shown in FIG. 6C are formed by two unit coils 81 and 82. The present embodiment is characterized in that a desired field gradient can be generated even if each unit coil is singly used. From this point of view, it can be said that the present embodiment has a construction in which each of three sets of $G_x$, $G_y$ and $G_z$ gradient coils in the conventional NMR imaging apparatus is provided with a multi-coil arrangement. The whole construction of the present embodiment is different from FIG. 1 in a driver circuit portion 100 shown in FIG. 2. Namely, a driver circuit as shown in FIG. 7 is employed. Unit drivers 101 to 104 are not provided for exclusive uses of $G_x$, $G_y$ and $G_z$ gradient coils and each unit driver can be used for generation of any one of field gradients in the x-, y- and z-directions. Only four unit drivers are prepared while the unit coils shown in FIGS. 6A to 6C are six. A switch circuit 105 selects four or less of the six unit coils so that they are connected to outputs of the unit drivers. Thus, for example, the switch circuit 105 is set such that the field gradient in the y-direction is generated by means of both the unit coils 71 and 72 and each of the field gradients in the z- and x-directions is generated by means of only one unit coil.

For example, in a case of planar imaging based on the so-called echo planar method disclosed by the above-mentioned U.S. Pat. No. 4,165,479, a field gradient in one direction must be reversed at a high speed and with a large amplitude or is severe in drive condition as compared with field gradients in two other directions. According to the embodiment shown in FIGS. 6A to 6C, a plurality of unit drivers may be allotted for the generation of the field gradient on which the severe condition is imposed while the generation of each of the field gradients in the two other directions is carried out by one unit driver. The direction of a field gradient to be subjected to reversals changes in accordance with the direction of a plane to be imaged. The switch circuit 105 can be set to change the connection of the unit drivers and the unit coils with each other so that images of planes in all directions are obtained. If the number of unit coils in each direction shown in FIGS. 6A to 6C and the number of unit drivers shown in FIG. 7 are further increased, a more wider free combination is possible, for example, so as to allow a high speed and a large amplitude for field gradients in two directions.

Figure 8:
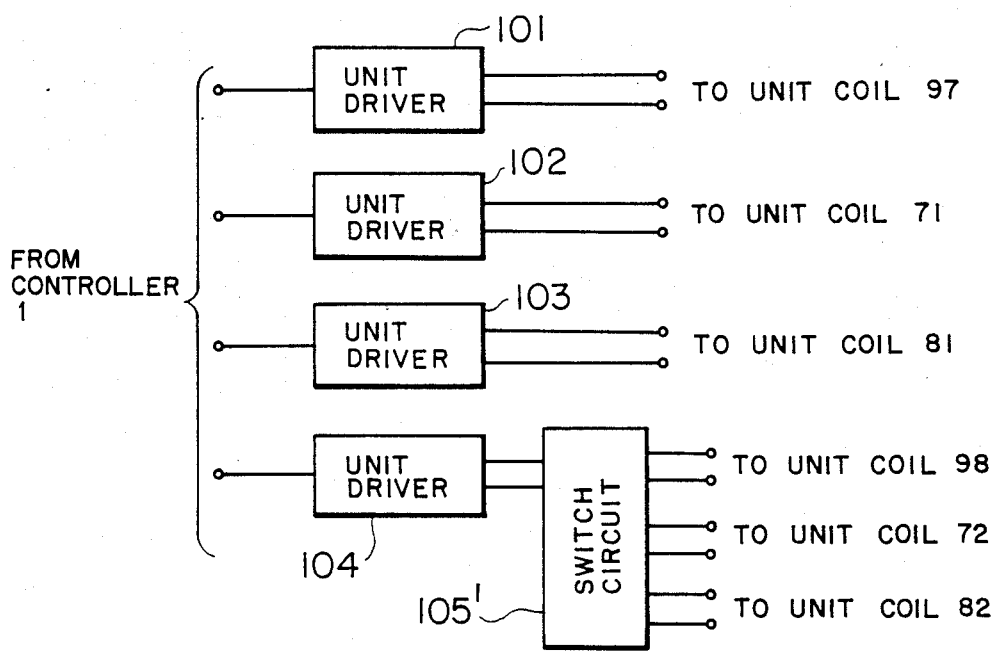

FIG. 8 shows a modified example of the construction shown in FIG. 7. In this example, the unit coils 97, 71 and 81 among the unit coils shown in FIGS. 6A to 6C are fixedly connected to unit drivers 101, 102 and 103 respectively and one of the remaining unit coils 98, 72 and 82 is selectively connected to a unit driver 104 through a switch circuit 105. This construction allows connection and change-over substantially similar to the circuit arrangement shown in FIG. 7.

All the unit coils shown in FIGS. 6B and 6C may be formed on the bobbin 5 of FIG. 2 in a laminated fashion. In this case, the coil takes a form different from that shown in FIG. 6B or 6C but along the circumferential surface of the bobbin. The division scheme mentioned in conjunction with FIG. 1, 3, 4 or 5 may be applied to each unit coil shown in FIG. 6A, 6B or 6C.

We claim:

1. An NMR imaging apparatus comprising:
static magnetic field generating means for generating a uniform static magnetic field in a first direction in a space to be observed; and
first, second and third field gradient generating means for generating in said space a first field gradient in said first direction and second and third field gradients in second and third directions orthogonal to said first direction and orthogonal to each other, respectively, at least one of said first, second and third field gradient generating means including a plurality of unit coils and a plurality of unit drivers for individually driving said unit coils respectively; wherein each of said unit coils has a similar form and an inductance which is substantially equal to one another.

2. An NMR imaging apparatus comprising:
static magnetic field generating means for generating a uniform static magnetic field in a first direction in a space to be observed; and
first, second and third gradient generating means for generating in said space a first field gradient in said first direction and second and third field gradients in second and third directions orthogonal to said first direction and orthogonal to each other, respectively, at least one of said first, second and third field gradient generating means including a plurality of uit coils and a plurality of unit drivers for individually driving said unit coils respectively; wherein said plurality of unit coils are arranged along said first direction and are selectively driven in accordance with the size of said space to be observed.

3. An NMR imaging apparatus comprising:
static magnetic field generating means for generating a uniform static magnetic field in a first direction in a space to be observed; and
first, second and third field gradient generating means for generating in said space a first field gradient in said first direction and second and third field gradients in second and third directions orthogonal to said first direction and orthogonal to each other, respectively, at least one of said first, second and third field gradient generating means including a plurality of unit coils having their inductances substantially equal to each other, a plurality of drivers for individually driving said unit coils respectively and controlling means for controlling outputs of said drivers into the substantially same waveform.

4. An NMR imaging apparatus comprising:
means for generating a uniform static magnetic field in a first direction in a space to be observed;
first, second and third field gradient generating coils for generating in said space a first field gradient in said first direction and second and third field gradients in second and third directions orthogonal to said first direction and orthogonal to each other, respectively, each of said first, second and third field gradient generating coils including a plurality of multiple unit coils through which individual currents respectively flow;
a plurality of unit drivers for causing current to flow through said plurality of unit coils respectively; and
switch means for connecting said plurality of unit drivers and said plurality of unit coils in any combination thereof.

5. An NMR imaging apparatus according to claim 4, wherein the number of said unit drivers is less than that of said unit coils.

6. An NMR imaging apparatus comprising:
means for generating a uniform static magnetic field in a first direction in a space to be observed:
first, second and third field gradient generating coils for generating in said space a first field gradient in said first direction and second and third field gradients in second and third directions orthogonal to said first direction and orthogonal to each other, respectively, each of said first, second and third field gradient generating coils including a plurality of multiple unit coils through which individual currents respectively flow;
first drivers connected individually to a part of said plurality of unit coils respectively;
at least one second driver prepared for causing a current to flow through said plurality of unit coils; and
switch means for selectively connecting the remaining of said plurality of unit coils to said second driver.

* * * * *